United States Patent [19]

Zeis

[11] 4,318,011
[45] Mar. 2, 1982

[54] ARRANGEMENT INCLUDING A DELAYED-ACTION SEMICONDUCTOR SWITCH

[75] Inventor: Jürgen Zeis, Berlin, Fed. Rep. of Germany

[73] Assignee: Licentia Patent-Verwaltungs-G.m.b.H., Frankfurt am Main, Fed. Rep. of Germany

[21] Appl. No.: 100,997

[22] Filed: Dec. 6, 1979

[30] Foreign Application Priority Data

Dec. 7, 1978 [DE] Fed. Rep. of Germany ....... 2852943

[51] Int. Cl.³ .......................................... H03K 17/60
[52] U.S. Cl. .................................. 307/300; 307/255; 307/289; 307/359
[58] Field of Search ............... 307/300, 255, 289, 254, 307/359; 323/22 T

[56] References Cited

U.S. PATENT DOCUMENTS 3,780,317 12/1973 Kurata et al. ........................ 307/300
4,055,794 10/1977 Ickes et al. ........................... 307/300
4,061,931 12/1977 Boschert ............................ 307/300

FOREIGN PATENT DOCUMENTS 2715133 12/1978 Fed. Rep. of Germany .

OTHER PUBLICATIONS

IBM Tech. Disclre. Bttn., Dynamic Transistor Antisaturation Control, by K. H. Knickmeyer, vol. 17, No. 4, 9/74, pp. 1091 & 1092.

Primary Examiner—Stanley D. Miller, Jr.
Assistant Examiner—B. P. Davis
Attorney, Agent, or Firm—Spencer & Kaye

[57] ABSTRACT

In a circuit including a semiconductor switch for switching a load current, the so-called storage time of the semiconductor switch, i.e. the delay occurring during switching from the conductive state to the blocking state, is regulated so as to decrease undesired variation of same, i.e. the storage period is maintained substantially constant. This is achieved in the case, for example, of a transistor in that, dependent on the collector voltage, the control or base current for switching on the transistor, and possibly a reverse base voltage applied to block the transistor, are varied so as to maintain the storage period at a desired value.

14 Claims, 9 Drawing Figures

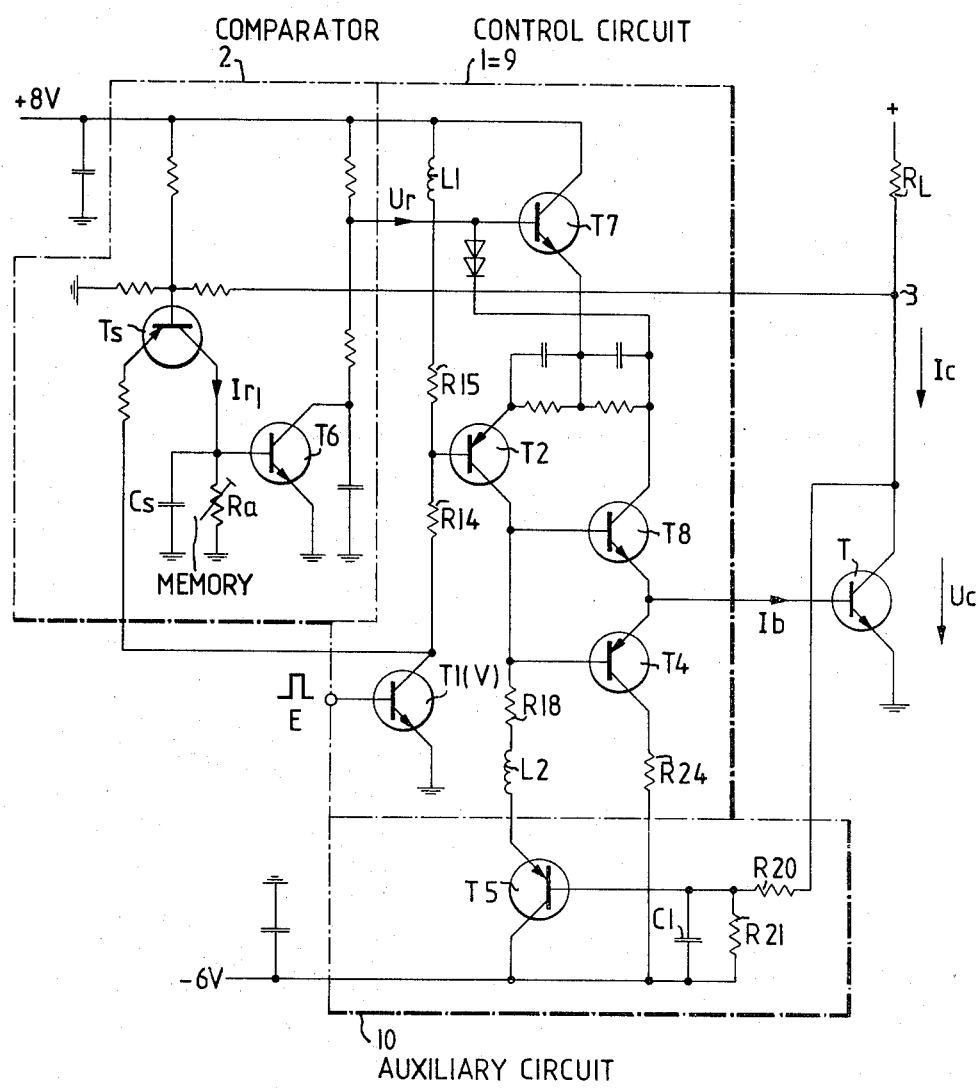

4,318,011

ARRANGEMENT INCLUDING A DELAYED-ACTION SEMICONDUCTOR SWITCH

BACKGROUND OF THE INVENTION

The present invention relates to a circuit arrangement including at least one delayed-action semiconductor switch and an auxiliary circuit for influencing the so-called storage period, which is the delay occurring during the switching from the conductive (switch-on phase) to the blocking (blocking phase) state of a semiconductor switch. More particularly, the present invention relates to such a circuit arrangement wherein the auxiliary circuit has a control path extending from a tap in the load current path leading through the switching path of the semiconductor switch to a circuit point in the control signal path leading to the control electrode of the semiconductor switch, and wherein an actual value, is when there is a change in the storage period, which is obtained at the tap and is used to shorten the storage period by influencing a control value which is fed to the control electrode of the semiconductor switch during the switch-on phase.

A circuit arrangement as described above is disclosed in connection with FIG. 2 of German Offenlegungsschrift (Laid-open Patent Application) No. P 27 15 133 of Oct. 12th, 1978. FIG. 1 of the present application shows a portion of the circuit of the above cited Patent Application. Insofar as it is of interest here, the Patent Application states:

" . . . the positively actuated switching stage . . . includes a switching transistor Ts6/9 and a PDM amplifier connected ahead of it . . . . In order to avoid storage times, the transistors must not be driven into saturation." A switching transistor Ts5 is connected as emitter-follower. "Without PDM signal the transistor Ts1 is blocked. Thus, the constant current source Ts2 is blocked as well. Ts3 is conductive because it receives its base current via resistors R5 and R6 and diodes Gr5 and Gr6. A diode Gr3, by base current limitation, prevents the transistor Ts3 from being driven into saturation. This is done in that, upon a drop in the collector-emitter voltage of the transistor Ts3 to approximately 1.5 V or less, current flows through the diode Gr3 to the collector. In this state the voltage drop from the reference point 28 remote from the base to the emitter is a combination of the threshold voltages of the diodes Gr5, Gr6 and the base-emitter diode. This is opposed by the voltage drop from point 28 via a collector input lead point 29 to the emitter. This voltage drop is a combination of the threshold voltage of diode Gr3 and the collector-emitter voltage which must not drop to the saturation voltage . . . . When a positive PDM pulse arrives at the terminal 27, Ts1 becomes conductive and switches on . . . the constant current source including transistor Ts2 . . . Ts3 is . . . blocked. After blockage . . . the emitter-follower Ts4 as well as the switching transistors Ts5 and Ts6/9 become conductive . . . . When the collector-emitter voltage of the switching transistors has dropped to about 6 V, a diode Gr8 becomes conductive. By means of base current limitation in Ts4 and Ts5 with the aid of diode Gr8, the switching transistor are prevented from being driven further into saturation . . . .

Particularly notable . . . are the measures for shortening the switching times which make it possible to . . . keep the power losses low."

The base current limitation for transistors Ts1 or Ts4, Ts5, respectively, by means of diodes Gr3 or Gr8, is based on the consideration that the storage period for a switching transistor, i.e. the switching delay during switching from the conductive to the blocking state, is particularly large if the transistor is driven into current saturation when it is in the forward conducting state. During switching into the blocking state the charge carriers can then not be transported away quickly enough. Therefore, care must be taken that current saturation will not be reached when the transistor is in the forward conducting state. This is possible by limiting the base current.

A criterion for the limitation of the base current by conducting away part of the current via diodes Gr3 or Gr8, respectively, to the associated collector of a switching transistor is the drop of the collector-emitter voltage to a value which is characteristic for the approximation to current saturation. Then the potential across the collector drops to such an extent that the above-mentioned diodes become conductive. Thus, the beginning base current limitation during a switch-on phase will significantly shorten the subsequent storage period.

It has now been found in some cases that the shortening of the storage period is insufficient and that in spite of short storage periods there may still occur operating malfunctions if the switching time is of any significance at all. This is the case, for example, when simultaneously switched transistors are connected in series. Experiments have shown that the collector-emitter voltages of series connected switching transistors in blocking state are divided up in very different amounts if their storage periods differ by only 25 ns. This is understandable if it is considered that when one transistor is blocked the other transistor is no longer able to reduce its free charge carriers by means of more collector current. In this connection, it is customary to overcome this problem by obtaining a uniform voltage distribution in that the switching transistors are connected in parallel with a chain of components which may include resistors, diodes and capacitors. These measures are complicated and lead to an increase in power losses.

Even in a switching amplifier (driver) for controlling a switching tube in a high power pulse duration modulator (PDM) it has been found that in spite of very short storage periods there may occur signal distortions (pulse distortions) and destruction of the switching transistors, particularly if the switching transistors are operated in series and/or in push-pull connections.

Signal distortions are noted in particular if the current to be switched through by the switching transistor is not constant but is variable in the sense of an amplitude comodulation of the pulse duration modulated pulse, i.e. if the load current—in a transistor this is the collector-emitter current—of the switching transistor is variable.

SUMMARY OF THE INVENTION

It is therefore the object of the present invention to provide an arrangement with which interfering influences resulting from deviations in the storage period from a desired value can be substantially reduced.

The above object is achieved according to the present invention by providing a circuit arrangement including at least one delayed-action semiconductor switch having a load current path leading through the switching path of the semiconductor switch and a control electrode connected via a control signal path to an input terminal for an input signal for switching the semiconductor switch between its conductive (switch-on phase) and blocking (blocking phase) states, and an auxiliary circuit means, having a first control path extending from a tap in the load current path to a circuit point in the control signal path, for obtaining an actual value at the tap and for utilizing same to vary a control value fed to the control electrode during the switch-on phase to shorten the storage period of the semiconductor switch, i.e. the delay occuring during switching of the semiconductor switch from the conductive (switch-on phase) to the blocking (blocking phase) state; wherein the auxiliary circuit means includes a comparator circuit means, connected in the first control path and having one input connected to the tap and a further input connected to the input terminal, for comparing the voltage at the tap with the input signal at the input terminal to provide an output signal responsive to the voltage at the tap during the storage period of the semiconductor switch; a memory connected to the comparator circuit means for storing a voltage value corresponding to the output signal from the comparator circuit means; and control circuit means, connected in the control signal path and responsive to the input signal and to the voltage value stored in the memory, for regulating the control current supplied to the control electrode of the semiconductor switch so as to maintain the storage period of the semiconductor switch substantially constant.

Alternatively, and preferably, the above object may be achieved by providing a circuit arrangement including at least one delayed-action semiconductor switch and an auxiliary circuit means as broadly described above wherein, instead of the comparator circuit means, memory and control circuit means, the auxiliary circuit means includes: a rectifier connected in the first control path between the control point and the tap for providing a control current to the tap when the residual voltage present across the switching path in the switched-through state of the semiconductor switch drops to values which lead to an undesireably high storage period for the semiconductor switch;

at least one component which is connected to the control signal path and which, if a control current is flowing in the control current path, causes a voltage drop, which increases with increasing control current, between the control point and the control electrode, the component having a resistance value which is approximately equal to the product of the forward conducting current gain of the semiconductor switch in its desired operating range and the voltage between the tap and the control electrode, divided by the forward load current of the semiconductor switch; and a current source, connected in the control signal path between the input terminal and the control point and responsive to the input signal at the input terminal, for furnishing an essentially constant current in the forward conducting state.

Additionally, features for influencing the storage period of the switching transistor to maintain some substantially constant, including an arrangement which particularly applicable when two switching transistors are connected in series, are likewise disclosed. The various disclosed embodiments and features of the invention are based on the following considerations:

Tests with switching transistors have shown that the storage period is not constant but depends, inter alia, on the collector current, the collector voltage, the base current, all in the forward conducting state of the switching transistor, as well as the base voltage in the blocked state and the temperature. When at least one of these parameters changes to a significant degree, malfunctions may occur if the storage period has any significance at all in the respective case of application. At the same time it is often necessary for the storage period to be as short as possible, for that purpose, a switching transistor must be actuated in such a manner that in the conductive state it is in the region of quasi-saturation. "Quasi-saturation" is that operation in which the collector-emitter voltage in the conductive state of the switching transistor (residual voltage), remains higher than the residual voltage occurring between collector and emitter during saturation operation (saturation voltage). With "quasi-saturation" there now exists a relationship between the load current, the residual voltage and the storage period. Summarizingly, it can be stated:

(a) at a constant residual voltage, the storage period increases with the load current;

(b) with a constant storage period, the residual voltage increases with the load current.

FIG. 2 gives a qualitative indication of these relationships, with the residual voltage Uc being plotted on the abscissa and the load or collector current Ic being plotted on the ordinate. In a circuit arrangement in which a constant residual voltage Ul results for a constant load current Il, a constant storage period ts of 150 ns will exist. If, however, the load current Ic changes with the residual voltage Ul remaining the same, the storage period ts will change considerably. With the aid of the present invention it has now become possible to find a way to obtain a substantially constant storage period ts in spite of the changes in the load current and/or in the collector-emitter voltage in the forward conducting state or in spite of changes of other parameters which in the end lead to a change in the load current or the collector-emitter voltage, respectively. FIG. 2 shows that this is possible if operation takes place on one of the curves ts=const. Care must, therefore, be taken that a relationship approximately corresponding to the curve shape is maintained between Ic and Uc. This is accomplished by a control circuit which becomes active during the switch-on phase and which contains the control path in the control circuit and acts on the control electrode.

BRIEF DESCRIPTION OF THE DRAWINGS

FIG. 9 is a detailed schematic circuit diagram of the embodiment of the invention shown in FIG. 8.

DETAILED DESCRIPTION OF THE PREFERRED EMBODIMENTS

Figure 3:
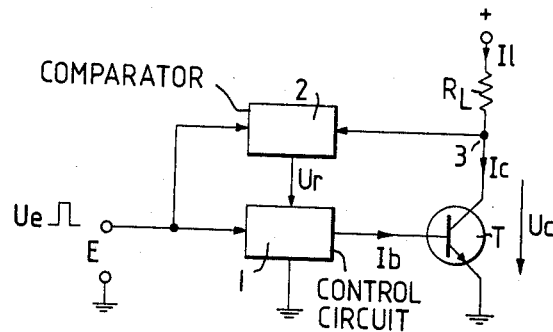
FIG. 3 is a basic block circuit diagram of one embodiment according to the invention.

FIG. 3 shows a switching transistor T with its collector current Ic, its collector-emitter voltage Uc and its base current Ib. The collector current is almost equal to the load current Il, which flows from the positive terminal of the d.c. voltage source through the load resistance $R_L$ to the collector of transistor T. A control circuit 1 is disposed in the control signal path leading from the input terminals E to the base or control electrode of the switching transistor T. This control circuit includes a control loop with a control path emanating from a tap 3 in the switching path (collector-emitter path) of transistor T and includes a comparator 2. In this comparator 2, a comparison is made between the collector voltage Uc obtained at tap 3 and the input voltage Ue obtained at the input terminal E. The result of the comparison is the control voltage Ur which controls the control circuit 1.

This control circuit 1, controlled by the input signal Ue, furnishes the base current Ib to the switching transistor T. When there is no input signal, i.e. in the switch-off or blocking phase of the input pulse Ue, a blocking voltage lies at the base of the transistor T. In switching operation, the storage period ts of the switching transistor T is dependent on the magnitude of the base current Ib in the forward conducting state and on the reverse base voltage in the blocked state. By means of the control voltage Ur, the comparator 2 controls the storage period ts to a given value in that it changes the base actuation of the switching transistor T.

Figure 4:
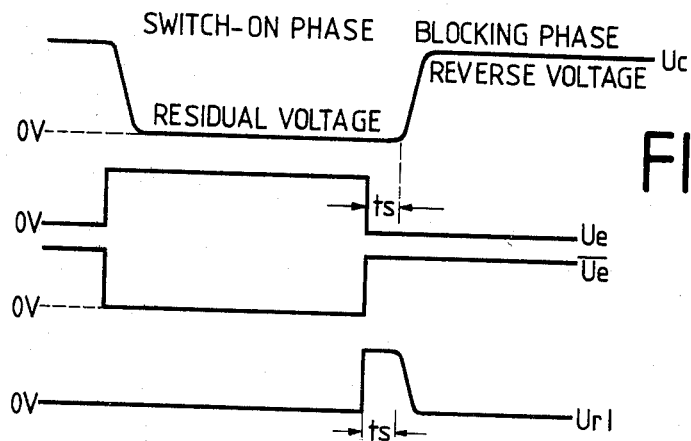
FIG. 4 shows the voltage curves for the circuit of FIG. 3.

The control mechanisms can be made clearer with the aid of FIG. 4. The delayed collector voltage Uc is associated with the input voltage Ue. Of the occurring delays, of interest here is the time which extends from the drop of the input voltage Ue to zero volt to the transition of the collector voltage Uc from the residual voltage near zero volt, which occurs in the switch-on phase, to the reverse voltage, which occurs during the blocking phase. This delay period is the storage period ts.

In the comparator 2 there now takes place a comparison between voltages Uc and Ue in the form of a difference formation between the voltage Ue, which is inverted compared to the voltage $\overline{Ue}$, and the collector voltage Uc. The result of the comparison is the voltage Url, a voltage which in its curve shows pulses corresponding to the length of the storage period ts. These pulses are intended to reduce even more the base current Ib of the switching transistor T during the forward conducting state with decreasing load current. However, since the storage period ts can be measured only after the end of each of the switch-on phases of the switching transistor T, the measured value Url can be used only to control the base current Ib of the respective subsequent switch-on phase.

Figure 5:
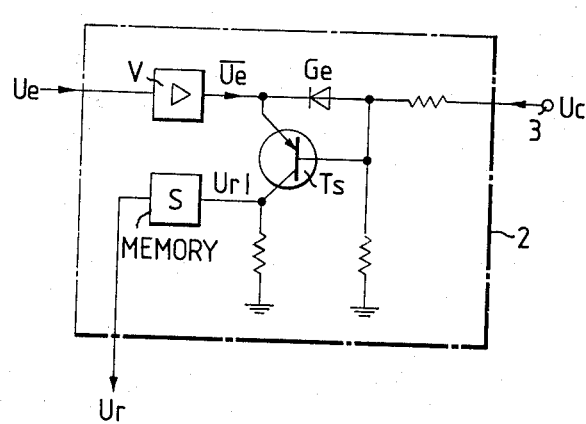
FIG. 5 is a detail circuit diagram of the content of block 2 of FIG. 3.

For that reason, the comparator 2, the details of which are shown in FIG. 5, must include a memory S in the form of an integrator in which the voltage time area is formed by Url and is held ready for the next switch-on phase of the switching transistor T. In the comparator 2, an inverting amplifier V initially forms the inverted voltage $\overline{Ue}$ from the input voltage Ue which is then fed, in the same manner as Uc, to the emitter of a transistor Ts. The collector of this transistor Ts then has a voltage $Url = \overline{Ue} - KUc$, where K is a constant for level equalization. At the output of memory S there results, as the voltage time integral of Url, the control voltage Ur for influencing the base current Ib through control circuit 1. The control circuit 1 is here operated in such a manner that with increasing storage period ts, the base current Ib is reduced in the subsequent switch-on phase so as to prevent the switching transistor T from going too far into saturation.

Because of the storage in memory S, the control basically has a delay of one period of the input voltage Ue. This delay, or the control time constant, respectively, of the control circuit is determined by the maximum frequency with which the load current Il and the keying ratio of the input signal Ue are allowed to change during regulation of the storage period. In an experiment at a switching frequency of 50 kHz, a maximum frequency of 1.5 kHz was determined for a change of load current and keying ratio. At higher frequencies for the change, the storage period fluctuates; however, the average can be kept constant.

In this embodiment it must be assured that the switch-off period of the input signal Ue is greater than the storage period ts in the fully controlled state. During practical operation a stable storage period of 200 ns was achieved for modulation frequencies of a keying ratio up to 1.5 kHz with a switching transistor which, according to its data sheet, had a storage period of 3 microseconds during switching operation with saturation.

Figure 6:
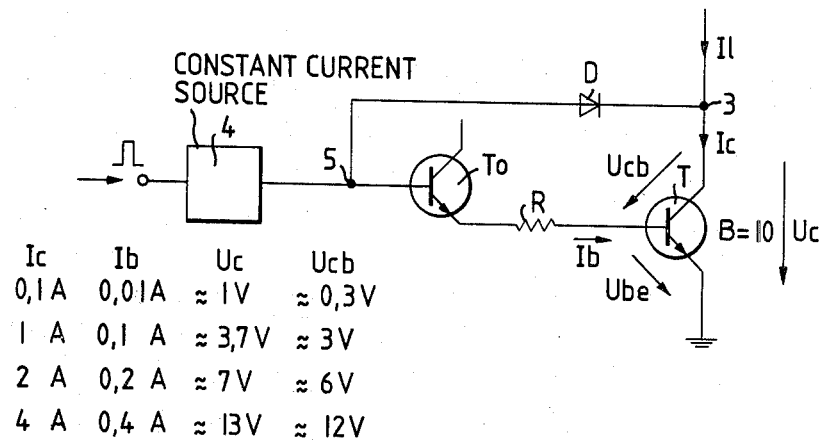
FIG. 6 is a simplified schematic circuit diagram of a preferred embodiment of the invention.
Figure 7:
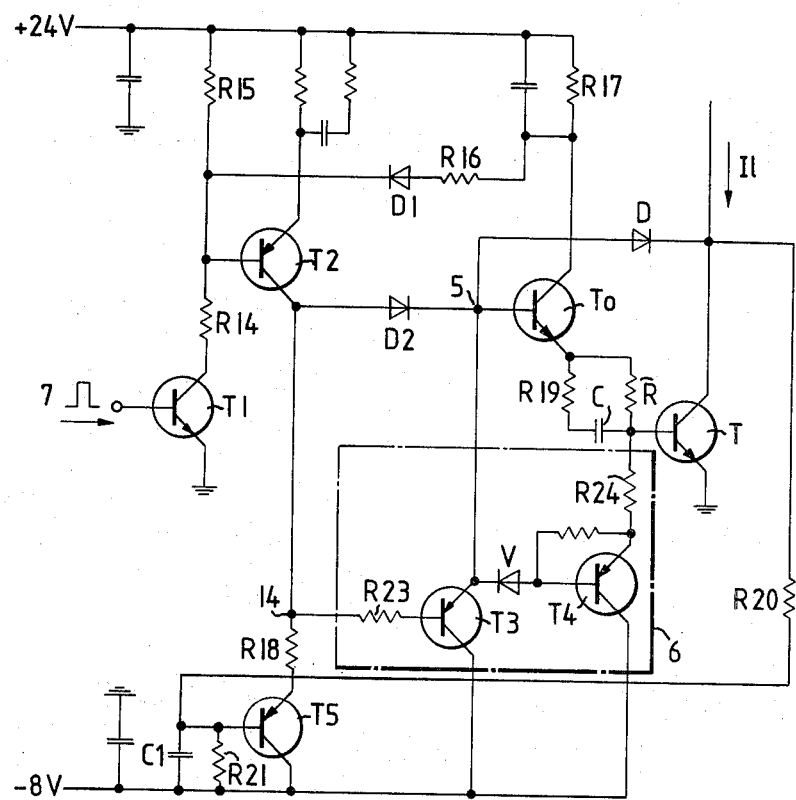
FIG. 7 is a detailed modified schematic circuit diagram of the embodiment of the invention shown in FIG. 8 and including additional features according to the invention for controlling the storage period.

While in FIGS. 3 to 5 the voltage Uc appearing at tap 3, as is the case there during each storage period, was decisive for the control of the base current, the relationships are much simpler if the voltage Uc, as it occurs during the switch-on phase, it obtained at tap 3 and used for regulation. This is shown in the embodiments of FIGS. 6 and 7. The fact that a substantially fixed relationship exists between the control current (base current) and the load current (collector current of a switching transistor) of a semiconductor switch, i.e. the current amplification, is an aid for the realization of these embodiments.

FIG. 6 shows the switching transistor T whose storage period ts is to be kept constant. It has a current gain factor B=10, a load current (collector current) Ic, a base current Ib, a collector-emitter voltage Uc, a base-emitter voltage Ube and a collector-base voltage Ucb.

The approximately correct assumption that the current gain factor B is independent of the load current Ic in the operating range is used as a basis. The switching transistor is switched on by a constant current source 4 via an emitter-follower transistor To and a series resistance R of, for example, 30 Ohm. With a collector current Ic of 0.1 A, which is practically equal to the external load current Il, the switching transistor T required a base current Ib of 10 mA in order to switch through, as indicated in the table which forms a part of FIG. 6. There then results a voltage drop of 0.3 V across the series resistor R.

The control electrode (base) of the switching transistor T which serves as a semiconductor switch has connected ahead of it (via the emitter-follower transistor To) a switching or control point 5 from which a return branches off which includes a diode D serving as a rectifier and leading to a tap 3 in the switching path formed by the collector-emitter path of the switching transistor T.

Since the threshold voltages of the emitter-follower transistor To and of the diode D are approximately equal, the residual collector voltage of the switching transistor T is equal to the voltage drop across the series resistance R plus the base-emitter voltage of the switching transistor T when the diode D is conductive. In this case, voltage Ucb is equal to the voltage drop across R. The table confirms this for R-30 Ohm. The values shown in the table for Ic are a result of the base current Ib multiplied by the current gain factor B of 10. The difference between voltage Uc and Ubc is the base-emitter voltage in the order of magnitude of 0.7 to 1 V. With a collector current Ic of 4 A the switching transistor T in the selected embodiment requires a base current of 0.4 A. The voltage drop across the series resistance R is 12 V. The residual voltage Uc is then 13 V.

The control effect of the diode D in conjunction with the series resistance R can easily be determined by the following considerations: If the constant current source 4 attempts to let a base current Ib of, for example, more than 0.4 A flow through the emitter-follower transistor To, or if the current gain factor B is greater than 10, the collector voltage Uc tries to drop from its value at quasi-saturation operation to the residual voltage at saturation. In this case, excess current is conducted from the constant current source 4 through diode D so that the base current Ib drops and the collector voltage again moves into the higher range for quasi-saturation. With the appropriate selection of the series resistance R, the storage period ts of a given switching transistor T can be corrected. While with a constant residual voltage in saturation operation the storage period changed by about 1.2 μs with a change in the load current from 0 to 2.5 A, the change in the storage period with the same change in current and a residual voltage which increased in dependence on the load current, i.e. under the influence of diode D and of the optimally dimensioned series resistance R, was about 50 ns for a commercially available transistor.

The optimum dimensioning of resistance R such that, in a given changing range for the load current, the resulting storage period is as independent of the load current as possible can be obtained by way of experiments in that the storage periods are determined for the switching transistor T for various series resistances R each time in the range of the given change in load current.

Figure 1:
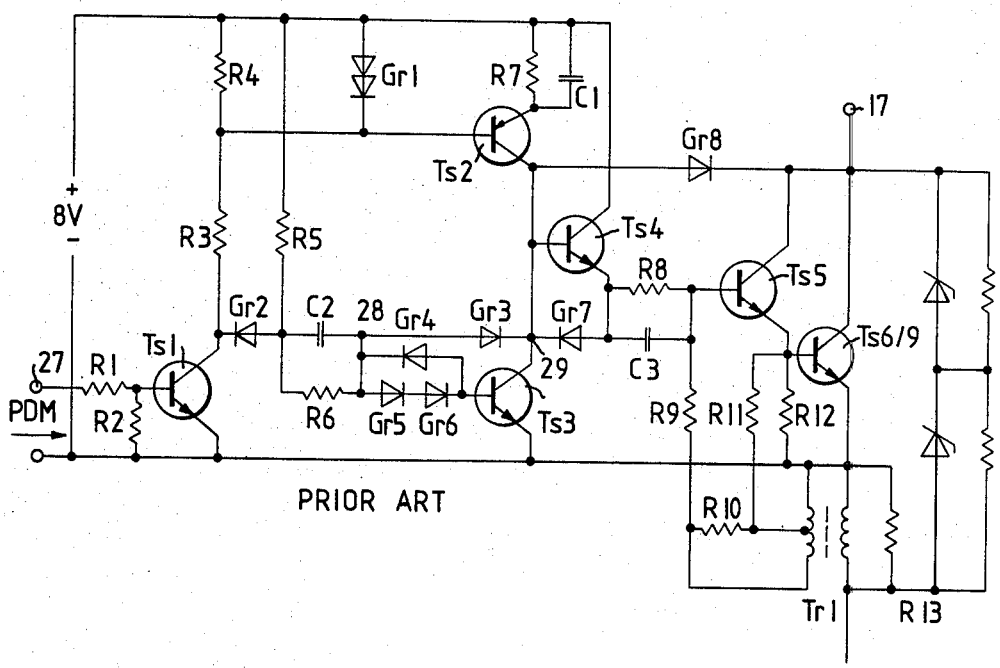
FIG. 1 is a schematic circuit diagram of an arrangement according to the prior art.
Figure 2:
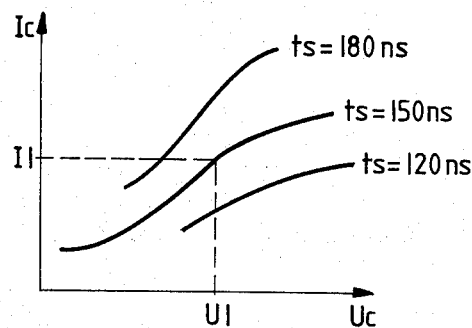
FIG. 2 is a family of curves used in explaining the present invention.

Alternatively, the optimum dimensioning of resistor R may be determined by way of calculation. For this purpose, initially the thermally permissible forward current Ic max and the average current gain B for the range of the intended changes in load current of a selected switching transistor T are determined from its data sheet. Then a diagram of the type shown in FIG. 2 must be made as a result of measurements and a curve must be selected for a constant storage period ts. Most expediently one of the curves is selected for which there exists an approximately linear relationship in the area of the load current changes between current Ic and voltage Uc.

The associated Ic/Uce values can be determined from the selected curve and from them, the series resistance R can be calculated according to the formulas:

$$Uc = Ube + R \cdot Ic/B; \quad Ucb = Uc - Ube = R \cdot Ic/B \quad (1)$$

$$R = (Uc - Ube) \cdot (B/Ic); \quad R = Ucb \cdot B/Ic \quad (2)$$

where Ube is the base-emitter voltage of the switching transistor which can be set to approximately equal 0.7 V. If resistance R is calculated according to the formula above for various pairs of values for Uc and Ic, the values for R will deviate only slightly from one another if the curve ts = const. is selected in a favorable manner so that an average for resistance R can be selected which, in a circuit arrangement according to FIG. 6, assures to a sufficient degree that the storage period ts of the switching transistor T remains essentially constant in the range of the occurring changes in load current.

FIG. 7 shows an embodiment in which the constant current source 4 according to FIG. 6 is shown in detail and a constant voltage source 6 is provided to block the switching transistor T. It has been found that although it is favorable for the forward conducting state of the switching transistor T if, as shown in FIG. 6, a constant current source 4 is provided whose constant current can be divided at circuit point 5 between the return including the diode D and the current branch leading to the control electrode of the switching transistor T, it is also favorable, in order to block the switching transistor T, for the base of switching transistor T to receive a reverse voltage from a constant voltage source (source 6 in FIG. 7).

The arrangement of FIG. 7 operates in detail as follows:

When a (positive) keying signal 7 is applied (switch-on phase) to the base of input transistor T1, the keying pulse causes transistor T1, via resistor R14 and R15, to switch on a constant current source which is formed mainly by a transistor T2. In order to thermally relieve transistor T2, the constant current is made dependent, with the aid of a diode D1 and a resistor R16 and the voltage drop across a resistor R17, on the load current of the emitter-follower transistor To. Transistor T2 furnishes current through a resistor R18 and a transistor T5, which operates as a controlled resistor, to the negative terminal (−8 V) of the direct voltage supply and, via a diode D2, to the emitter-follower transistor To which has already been described in connection with FIG. 6. Via resistor R, transistor To furnishes the base current to the switching transistor T. In dependence on the load current I1, the base current of transistor T is controlled via diode D during the switch-on phase as described in connection with FIG. 6. A resistor R19 and a capacitor C connected in parallel with the resistor R serve to accelerate switching. The emitter-follower transistors T3 and T4 in the constant voltage source 6 remain blocked during the switch-on phase of transistors To, T, T1, T2.

Without the keying signal 7, i.e. during the switch-off phase, transistor T1 is blocked. Thus, the constant current source transistor T2 and the emitter-follower transistor To are also blocked. However, the emitter-follower transistors T3, T4 become conductive and apply a reverse voltage of almost −8 V across the base of the switching transistor T in order to block it quickly.

Further details of FIG. 7, in particular, the operation of the resistors R20, R21, capacitor C1 and transistor T5, will be discussed below after FIG. 8 has been described which is more general in this respect.

Figure 8:
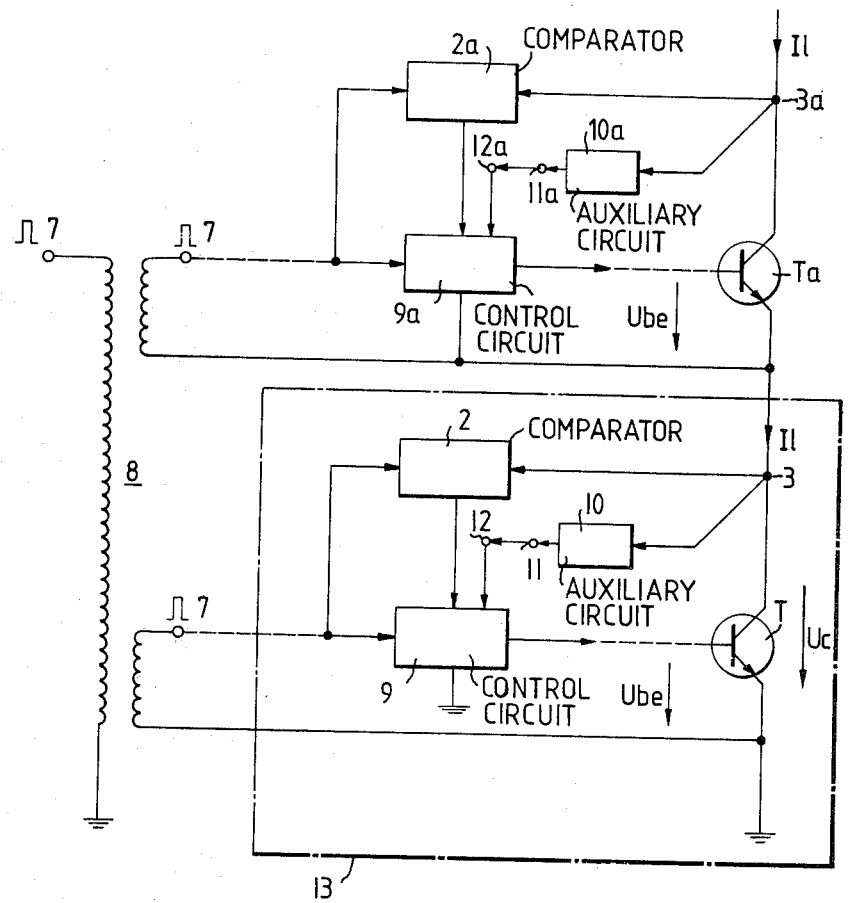
FIG. 8 is a block circuit diagram of an embodiment of the invention showing additional features for controlling the storage period.

FIG. 8 relates to additional auxiliary means for influencing the storage period ts in the sense of a fine control, as opposed to the rough or coarse control, as explained thus far in connection with FIGS. 3 through 7.

A particularly interesting field of use for the additional fine control is the series connection of switching paths formed by semiconductor switches, particularly switching transistors. For simultaneous switching of semiconductor switches, it is very important that the switching periods of all series connected semiconductor switches are identical, i.e. are matched to a common desired value. FIG. 8 and the still unexplained portion of FIG. 7 relate to this feature.

FIG. 8 shows two transistors T, Ta with series connected switching paths, i.e. emitter-collector paths. A transformer 8 is provided for controlling the bases of the switching transistors. The transformer 8 receives positive keying signals 7 as input pulses at its primary winding. These keying signals 7 reappear at the respective secondary windings of the transformer 8 and are fed from there through a control circuit 9 or 9a, respectively, to the base of a switching transistor T or Ta, respectively. The control circuits 9 and 9a, respectively, together with comparators 2 and 2a, respectively, and taps 3 and 3a, respectively, initially perform the same functions, i.e. the rough or coarse control, as the identically named components 1, 2 and 3, respectively, in FIG. 3. From the taps 3 and 3a, at which the collector-emitter voltages are obtained at least during the blocking periods of the associated switching transistors T and Ta, respectively, the collector-emitter voltages are transferred to auxiliary devices 10 and 10a, respectively. The devices 10 and 10a are provided with outputs 11 and 11a, respectively, while the control circuits 9 and 9a are each provided with an additional control input 12 or 12a, respectively.

If now, for example, the output 11 is connected with the input 12a and the output 11a with the input 12, the following mode of operation results for the additional auxiliary device 10 or 10a. If the collector-emitter voltage Uc of the transistor T is low at tap 3 during a blocking phase, that means that the switching transistor T blocks too slowly. This information is transmitted, via device 10, output 11 and input 12a to the control circuit 9a, which thus is to be caused to likewise delay, during the following blocking phase, the switching of the transistor Ta, i.e. to extend its storage period. This can be done by reducing the magnitude of the reverse base voltage of this transistor Ta. In a similar way, the transistor T can be influenced by the tap 3a via the device 10a, its output 11a, the control input 12 and the control circuit 9.

However, the preferred embodiment of the arrangement shown in FIG. 8 is that in which, as shown, the terminals 11 and 12 are connected together and the terminals 11a and 12a are connected together. Then the mode of operation is as follows: If the voltage across tap 3 in the blocking phase is too low, then the switching transistor T is blocking too slowly. This information is fed via device 10 and the terminals 11 and 12 to the control circuit 9 causing the circuit 9 to accelerate the blocking of the switching transistor T during the subsequent blocking phase by increasing the magnitude of the reverse base voltage.

The boxed circuit portion 13 of FIG. 8 corresponds to the more detailed schematic circuit shown in FIG. 9 which will be discussed later.

Instead of the circuit of FIG. 9, a modified circuit shown in FIG. 7 is preferred which will now be discussed further to supplement its earlier description. The modification consists of replacing the comparator 2 and the control circuit 9 by the diode D, the emitter follower To, the constant current source 4 and the resistor R shown in FIG. 6.

For finely controlling the storage period ts, it is influenced within the switch-off phase of the keying signal 7, which actually should coincide with the blocking phase of the switching transistor T but which is not the case as a result of the storage period ts. After the end of the switch-on phase of keying signal 7, the storage period ts can be influenced to a certain degree by the magnitude of the reverse base voltage of the switching transistor T, but only between the end of the switch-on phase of the keying signal 7 and the beginning of the actual blocking of the switching transistor T, i.e. only during the storage period ts. For these purposes of influencing, an additional control path is provided which leads away from tap 3 and is equipped with additional circuitry (corresponding to the auxiliary means 10 of FIG. 8) including the resistors R20 and R21 and an integration capacitor C1. The additional control path initially leads to the base of the transistor T5. Thus, codetermined by the voltage dividing ratio between resistors R20 and R21, the collector voltage Uc of transistor T controls the transistor T5. During the blocking phase of the keying signal 7, i.e. when transistor T2 is blocked, the voltage at the switching point 14 is approximately the emitter voltage of transistor T5, which voltage, via resistor R23 is responsible for the control or base current of transistor T3.

Since during the blocking phase of the keying signal 7, the transistor T1 blocks, and thus transistors T2 and T0 are likewise blocked, while the switching transistor T initially is still conducting, the emitter-followed transistors T3 and T4 become conductive and apply a reverse base voltage across the base of the switching transistor T so as to block it more rapidly. The magnitude of this reverse base voltage influences the storage period ts so that if a plurality of switching transistors (T and Ta in FIG. 8) are connected in series, the reverse voltages which are common to all collector-emitter paths are divided in a controlled manner to the individual collector-emitter paths. This common reverse voltage will be divided very unevenly if the blocking periods of the series connected switching transistors differ from one another by no more than 25 ns, because during a premature blocking of one of these transistors, the other transistor no longer has a chance to reduce the free charge carriers through further collector current.

If, for example, the collector voltage Uc of transistor T is still very low during the switch-on phase, this means that transistor T blocks slower than the series-connected transistor Ta (FIG. 8). The collector voltage Uc of transistor T then travels via resistor R20 to the base of transistor T5 which thus receives a strongly negative potential. Consequently, transistor T5 will become conductive to a large degree so that the potential at switching point 14 is displaced toward negative values and, will reach, via the already switched through emitter-follower transistors T3, T4, the resistors R23, R24 and the rectifier V, the base of transistor T and in this way accelerate the blocking of transistor T so that therefore the storage period ts of transistor T is shortened.

If, however, the reverse collector voltage of transistor T is high, this means that, in a series connection with transistor Ta (FIG. 8), transistor T will be blocked faster. During blocking the high collector reverse voltage Uc reduces the negative potential at the base of transistor T5 and thus also the potential at the base of transistor T. This slows down the blocking action of transistor T, i.e. its storage period ts is extended so that the storage period is matched to that of the switching transistor Ta (FIG. 8).

The integrating capacitor C1, together with the resistor R20, causes the divided voltage pulses from tap 3 as they occur there during the blocking phase, to be available at the base of transistor T5 also during the time until the next blocking phase. Capacitor C1 is thus a memory contained in the additional auxiliary circuit 10 (FIG. 8) for the control value (voltage Uc across tap 3) which has been fed in on the additional control path 3-10-11-12.

For some cases it may be sufficient if only one of the two switching transistors T or Ta, in an arrangement similar to that of FIG. 8, has associated with it a circuit as shown in FIG. 7 for influencing the storage period during the storage period. Preferably, however, each of the series connected switching transistors which is to be switched simultaneously with the other switching transistors has an associated circuit for influencing its storage period.

As can be seen in FIG. 7, the transistors T3 and T4 simultaneously serve as a device which makes ineffective the additional control path leading through resistor R20 with respect to its influence on the base of the switching transistor T during the switch-on phase of the latter, except during the storage period.

In FIG. 9, the same reference numerals as in FIGS. 3, 5, 7 are used in as far as components of similar functions are used. Accordingly only differing components and functions will be discussed in the following: One difference between FIGS. 9 and 5 is that instead of the input voltage Ur1 for the memory S there is now an input current Ir1 (having a shape similar to Ur1 in FIG. 4) which is charging a storage capacitor Cs during the time periods ts. This storage capacitor Cs is discharged by an adjustable resistor Ra. The voltage across capacitor Cs is proportional to the storage time ts.

If the storage time ts is short, the voltage at the base of an amplifying transistor T6 is so low that the transistor T6 is blocked. As a result, the voltage Ur becomes equal to the supply voltage of +8 V. An emitter follower T7 is controlled by the voltage Ur. Caused by the high voltage at the emitter of the transistor T7 a large collector current of the constant current source transistor T2 is achieved, which causes a high voltage drop across the resistor R 18. Thus the base voltage of the emitter follower transistor T8 is raised and transistor T8 supplies a large base current Ib for the switching transistor T.

If the storage time ts is large, the voltage at the base of the transistor T6 becomes so high that this transistor is conducting. As a result, the voltage Ur decreases, and with the aid of the transistors T2 and T8 the base current Ib of the switching transistor T is reduced. Thus the storage time ts is reduced to such an extent that a balanced state is achieved.

The transistors T4 and T5 in principle work in the same manner as in FIG. 7. The choke L1 is to accelerate the switching on of the transistor T and the choke L2 will accelerate the blocking of this transistor.

It will be understood that the above description of the present invention is susceptible to various modifications, changes and adaptations, and the same are intended to be comprehended with the meaning and range of equivalents of the appended claims.

What is claimed is:

1. In a circuit arrangement including at least one delayed-action semiconductor switch having a load current path leading through the switching path of said semiconductor switch and a control electrode connected via a control signal path to an input terminal for an input signal for switching said semiconductor switch between its conductive (switch-on phase) and blocking (blocking phase) states, and auxiliary circuit means, having a first control path extending from a tap in said load current path to a circuit point in said control signal path, for obtaining an actual value at said tap and for utilizing same to vary a control value fed to said control electrode during said switch-on phase to shorten the storage period of said semiconductor switch, i.e., the delay occurring during switching of said semiconductor switch from the conductive (switch-on phase) to the blocking (blocking phase) state; the improvement wherein said auxiliary circuit means includes:

comparator circuit means, connected in said first control path and having one input connected to said tap and a further input connected to said input terminal, for comparing the voltage at said tap with the voltage of the input signal at said input terminal to provide an output signal responsive to the voltage at said tap during said storage period of said semiconductor switch;

a memory connected to said comparator circuit means for storing a voltage value corresponding to said output signal; and control circuit means, disposed in said control signal path and responsive to said input signal and to the voltage value stored in said memory, for regulating the control current supplied to said control electrode of said semiconductor switch during the next switch-on phase so as to maintain said storage period of said semiconductor switch substantially constant.

2. In a circuit arrangement including at least one delayed-action semiconductor switch having a load current path leading through the switching path of said semiconductor switch and a control electrode connected via a control signal path to an input terminal for an input signal for switching said semiconductor switch between its conductive (switch-on phase) and blocking (blocking phase) states, and auxiliary circuit means, having a first control path extending from a tap in said load current path to a control point in said control signal path, for obtaining an actual value at said tap and for utilizing same to vary a control value fed to said control electrode during said switch-on phase to shorten the storage period of said semiconductor switch, i.e., the delay occurring during switching of said semiconductor switch from the conductive (switch-on phase) to the blocking (blocking phase) state; the improvement wherein said auxiliary circuit means includes:

a rectifying means connected in said first control path between said control point and said tap for providing a control current to said tap when the residual voltage present across said switching path in the conductive state drops to values which lead to an undesirably high storage period for said semiconductor switch;

at least one component which is connected in said control signal path and which, when a control current is flowing in said control signal path, causes a voltage drop, which increases with increasing control current, between said control point and said control electrode, said component having a resistance value which is approximately equal to the product of the forward conducting current gain of said semiconductor switch in its desired operating range and the voltage between said tap and said control electrode, divided by the forward load current of said semiconductor switch; and a constant current source means connected in said control circuit path between said input terminal and said control point and responsive to the input signal at said input terminal for furnishing an essentially constant current in the forward conducting state, whereby said auxiliary circuit means regulates said storage period in the sense of an improved constancy.

3. An arrangement as defined in claim 1 or 2 wherein: said semiconductor switch is a transistor; said control electrode is the base of said transistor; and said tap is connected to the collector of said transistor.

4. A circuit arrangement as defined in claim 2 wherein said component is a resistor.

5. A circuit arrangement as defined in claim 2 further comprising an emitter-follower amplifier connected in series with said component between said control point and said control electrode.

6. A circuit arrangement as defined in claim 5 wherein said semiconductor switch is a transistor; and wherein the circuit elements in the leads to said transistor, including said component are dimensioned such that, in the forward conducting operating range of said transistor, changes in the collector-base voltage are essentially equal to changes in said voltage drop across said component.

7. A circuit arrangement as defined in claims 2, 5, or 6 further comprising: means, including a constant voltage source having its output connected to said control electrode of said semiconductor switch, for applying a reverse voltage to said control electrode to aid in the blocking of said semiconductor switch; and circuit means for blocking said constant voltage source during the time that said constant current source is switched on.

8. A circuit arrangement as defined in claim 1 or claim 2 further comprising an additional auxiliary circuit means for controlling said storage period of a said semiconductor switch by influencing the reverse voltage across said control electrode of said semiconductor switch each time within a storage period.

9. A circuit arrangement as defined in claim 8 wherein said additional auxiliary circuit means includes: a memory for storing a voltage corresponding to the voltage across said tap until the reverse voltage at said control electrode is influenced again within the succeeding storage period, and means controlled by the voltage stored in said memory for applying a reverse voltage to said control electrode during said storage period.

10. A circuit arrangement as defined in claim 8 wherein said additional auxiliary circuit means controls said reverse voltage at said control electrode in a manner to maintain said storage period substantially constant.

11. A circuit arrangement including a pair of semiconductor switches with associated auxiliary circuit means as defined in claim 1 or claim 2 wherein said semiconductor switches have their said switching paths connected in series, and further comprising:

at least one additional control path leading from said tap to one of said semiconductor switches to said control electrode of one of said semiconductor switches, said additional control path including an additional auxiliary circuit means, responsive to the voltage at the associated said tap, for influencing the reverse voltage across the associated said control electrode within each storage period so as to match the respective storage periods of said pair of semiconductor switches.

12. A circuit arrangement as defined in claim 11 wherein said additional control path is connected between said tap and said control electrode of the same one of said semiconductor switches and wherein said additional auxiliary circuit means is responsive to the voltage of said tap to shorten said storage period when said voltage at said tap is too low at the beginning of said storage period.

13. A circuit arrangement as defined in claim 12 wherein said additional auxiliary circuit means includes means for increasing the magnitude of the reverse control voltage across said control electrode when said voltage at said tap is too low at the beginning of said storage period.

14. A circuit arrangement as defined in claim 11 wherein said additional auxiliary circuit means includes means for interrupting the influence of said additional auxiliary circuit means on the reverse control voltage at the associated said control electrode during the portion of the conductive phase which is outside of the storage period of the one of said semiconductor switches having said associated said control electrode.

* * * * *